(12) United States Patent
Kim et al.

(10) Patent No.: US 11,353,972 B2
(45) Date of Patent: Jun. 7, 2022

(54) DISPLAY DEVICE WITH TOUCHSCREEN

(71) Applicant: LG Display Co., Ltd., Seoul (KR)

(72) Inventors: Jong-Hoy Kim, Paju-si (KR);
Chang-Hoon Jeon, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/931,255

(22) Filed: Jul. 16, 2020

(65) Prior Publication Data

US 2021/0072849 A1   Mar. 11, 2021

(30) Foreign Application Priority Data

Sep. 9, 2019   (KR) .................. 10-2019-0111732

(51) Int. Cl.
*G06F 3/041* (2006.01)
*H01L 27/32* (2006.01)
*H01L 51/52* (2006.01)

(52) U.S. Cl.
CPC ............ *G06F 3/041* (2013.01); *H01L 27/323* (2013.01); *H01L 27/3272* (2013.01); *H01L 51/5281* (2013.01)

(58) Field of Classification Search
CPC .................. G06F 3/0412; G06F 3/044; G06F 2203/04105; G06F 2203/04102; G06F 3/0488; G06F 3/016; G06F 3/03547; G06F 3/04883; G06F 3/01; G06F 3/0414
See application file for complete search history.

(56) References Cited

U.S. PATENT DOCUMENTS

| | | | | |
|---|---|---|---|---|
| 8,583,187 B2* | 11/2013 | Kim | ................ | G06F 1/1656 |
| | | | | 455/566 |
| 9,313,887 B2* | 4/2016 | Gao | ................ | H05K 3/4644 |
| 9,442,608 B2 | 9/2016 | Ishizaki et al. | | |
| 9,665,210 B2* | 5/2017 | Kim | ................ | G06F 3/041 |
| 9,952,734 B2* | 4/2018 | Kim | ................ | G06F 3/0445 |
| 10,156,948 B2 | 12/2018 | Ishizaki et al. | | |
| 10,386,981 B2 | 8/2019 | Ishizaki et al. | | |
| 10,908,654 B2* | 2/2021 | Oster | ................ | G06F 1/1637 |
| 2007/0002192 A1 | 1/2007 | Nishino et al. | | |
| 2008/0095985 A1* | 4/2008 | Frey | ................ | H05K 3/061 |
| | | | | 428/338 |
| 2012/0062511 A1 | 3/2012 | Ishizaki et al. | | |
| 2012/0127094 A1 | 5/2012 | Jeong | | |

(Continued)

FOREIGN PATENT DOCUMENTS

| ER | 2933712 A1 | 10/2015 |
|---|---|---|
| KR | 10-2007-0001818 A | 1/2007 |

(Continued)

OTHER PUBLICATIONS

European Patent Office, Extended European Search Report and Opinion, EP Patent Application No. 20183130.2, dated Dec. 21, 2020, eight pages.

*Primary Examiner* — Olga V Merkoulova
(74) *Attorney, Agent, or Firm* — Fenwick & West LLP

(57) ABSTRACT

A display device with a touchscreen is provided. The display device includes a display panel having an electrode layer in a display area and a non-display area thereof, and a panel ground layer in the non-display area, and a touchscreen over the display panel and including a touch ground layer having an area overlapping with at least one of the electrode layer and the panel ground layer.

17 Claims, 11 Drawing Sheets

(56) References Cited

U.S. PATENT DOCUMENTS

| | | | | |
|---|---|---|---|---|
| 2012/0306357 | A1* | 12/2012 | Yamamoto | H01L 51/5275 |
| | | | | 313/504 |
| 2013/0169585 | A1* | 7/2013 | Choon | G06F 3/0445 |
| | | | | 345/174 |
| 2013/0271675 | A1* | 10/2013 | Misaki | G06F 3/041 |
| | | | | 349/12 |
| 2013/0271942 | A1* | 10/2013 | Kim | G06F 1/1698 |
| | | | | 361/816 |
| 2014/0124746 | A1* | 5/2014 | Hwang | H01L 29/42384 |
| | | | | 257/43 |
| 2014/0253827 | A1* | 9/2014 | Gao | H05K 3/4644 |
| | | | | 349/12 |
| 2015/0145814 | A1* | 5/2015 | Burger | G06F 3/0445 |
| | | | | 345/174 |
| 2015/0301685 | A1* | 10/2015 | Kim | G06F 3/0418 |
| | | | | 345/173 |
| 2016/0334907 | A1 | 11/2016 | Ishizaki et al. | |
| 2017/0090652 | A1 | 3/2017 | Sato et al. | |
| 2017/0228067 | A1* | 8/2017 | Kim | G06F 3/0446 |
| 2018/0321779 | A1 | 11/2018 | Huang | |
| 2019/0023860 | A1* | 1/2019 | Kim | C08J 7/046 |
| 2019/0064971 | A1 | 2/2019 | Ishizaki et al. | |
| 2019/0310730 | A1 | 10/2019 | Ishizaki et al. | |
| 2019/0350085 | A1* | 11/2019 | Noma | G06F 3/0445 |
| 2020/0108587 | A1* | 4/2020 | Han | C09D 133/16 |

FOREIGN PATENT DOCUMENTS

| | | |
|---|---|---|
| KR | 10-2012-0028217 A | 3/2012 |
| KR | 10-2012-0053855 A | 5/2012 |
| KR | 10-2012-0077451 A | 7/2012 |

\* cited by examiner

| Potential at lower portion of GIP | 5th Embodiment | Example 1 | 3rd Embodiment | 6th Embodiment |
|---|---|---|---|---|
| | -0.3V | -10V | -0.02V | -2.6V |

DISPLAY DEVICE WITH TOUCHSCREEN

CROSS-REFERENCE TO RELATED APPLICATIONS

This application claims the benefit of Republic of Korea Patent Application No. 10-2019-0111732 filed on Sep. 9, 2019, which is hereby incorporated by reference as if fully set forth herein.

BACKGROUND

Field

The present disclosure relates to a display device with a touchscreen.

Discussion of the Related Art

In accordance with development of information technologies, the market for a display device as a medium connecting between a user and information is expanding. As such, use of display devices such as an organic light emitting display (OLED) device, a quantum dot display (QDD) device, a liquid crystal display (LCD) device and a plasma display panel (PDP) device is increasing.

A part of the above-mentioned display devices, for example, an LCD device or an OLED device, includes a display panel including a plurality of sub-pixels arranged in a matrix form, a driver configured to output a drive signal for driving the display panel, and a power supply configured to generate electric power to be supplied to the display panel or the driver. The driver includes a scan driver configured to supply scan signals (or gate signals) to the display panel, and a data driver configured to supply data signals to the display panel.

In addition, the above-mentioned display devices may be embodied not only as a portable information appliance such as a smart phone, but also as a notebook computer, a computer monitor, a home electronic appliance, or the like. Each display device included in such a product group includes a touchscreen (or touch sensors) as an input means for a user.

When drive signals, for example, scan signals and data signals, are supplied to sub-pixels formed at a display panel in a display device as mentioned above, selected ones of the sub-pixels transmit light or directly emit light and, as such, the display device may display an image. The display device may receive user input through operation of the user touching the display panel, and may perform hardware or software operation corresponding to the received user input.

SUMMARY

Accordingly, the present disclosure is directed to a display device with a touchscreen that substantially obviates one or more problems due to limitations and disadvantages of the related art.

An object of the present disclosure is to provide a display device capable of suppressing electrostatic charges from being diffused to a circuit (a transistor constituting a shift register, or the like) on a lower substrate of a display panel, thereby not only avoiding degradation in screen quality, but also reducing or avoiding adverse influence on the circuit (malfunction, reliability degradation, drivability degradation, etc.).

Additional advantages, objects, and features of the invention will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the invention, as embodied and broadly described herein, a display device includes a display panel having an electrode layer in a display area and a non-display area thereof and a panel ground layer in the non-display area, and a touchscreen over the display panel and including a touch ground layer having an area overlapping with at least one of the electrode layer and the panel ground layer.

The touch ground layer may be disposed at at least one of first and second surfaces of a base layer constituting the touchscreen.

The touch ground layer may have a width greater than that of the panel ground layer.

The touch ground layer may include a first touch ground layer disposed at the first surface of the base layer and a second touch ground layer disposed at the second surface of the base layer. The second surface of the base layer may be a surface facing the display panel.

The second touch ground layer may have an area spaced apart from the electrode layer and overlapping with the panel ground layer.

The second touch ground layer may have an area adjacent to the electrode layer and overlapping with the panel ground layer.

The second touch ground layer may have a first area overlapping with the electrode layer and a second area overlapping with the panel ground layer.

The display device may further include a polarization plate between the display panel and the touchscreen, and an optically clear adhesive layer between the polarization plate and the touchscreen.

Alternatively, the display device may further include a polarization plate between the display panel and the touchscreen, and an optically clear adhesive layer between the polarization plate and the touchscreen, and the second touch ground layer may not overlap with the panel ground layer while overlapping with the electrode layer.

The second touch ground layer may have a greater width than the panel ground layer while having a width equal to or greater than a width of the first touch ground layer.

The display device may further include an optically clear adhesive layer on the touchscreen, and a cover substrate on the optically clear adhesive layer.

The display panel has a lower substrate and an upper substrate, and at least one of the lower substrate and the upper substrate is formed of a plastic material.

In another aspect of the present disclosure, a display device includes a display panel having an electrode layer in a display area and a non-display area thereof and a panel ground layer in the non-display area, a polarization plate on one surface of the display panel, a lower optically clear adhesive layer on the polarization plate, a touchscreen on the lower optically clear adhesive layer and including a touch ground layer having an area overlapping with at least one of the electrode layer and the panel ground layer, an upper optically clear adhesive layer on the touchscreen, and a cover substrate on the upper optically clear adhesive layer.

The touch ground layer may include a first touch ground layer disposed at one surface of a base layer constituting the touchscreen, and a second touch ground layer disposed at the other surface of the base layer. The other surface of the base layer may be a surface facing the display panel.

The second touch ground layer may have a width greater than that of the panel ground layer, and a width equal to or greater than a width of the first touch ground layer.

The present disclosure may suppress diffusion of electric charges to a circuit (a transistor constituting a shift register) on a lower substrate of a display panel on the basis of a structure capable of efficiently discharging static electricity accumulated on a surface of a cover substrate or a side surface of the cover substrate and, as such, may have an effect of avoiding quality degradation of a screen. In addition, the present disclosure may avoid a problem of induction or diffusion of electric charges into the circuit on the lower substrate of the display panel and, as such, may have an effect of reducing or avoiding adverse influence on the circuit (malfunction, reliability degradation, drivability degradation, etc.).

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the disclosure and along with the description serve to explain the principle of the disclosure. In the drawings.

DETAILED DESCRIPTION

Hereinafter, preferred embodiments of the present disclosure will be described in detail with reference to the accompanying drawings.

A display device with a touchscreen according to an exemplary embodiment of the present disclosure is embodied as a television, a navigation, an image player, a Blu-ray player, a personal computer (PC), a home theater, a tablet PC, a smart phone (mobile phone), etc.

In addition, for a display device with a touchscreen according to an exemplary embodiment of the present disclosure, a display panel such as a liquid crystal display (LCD) panel, an organic light emitting display (OLED) panel, a quantum dot display (QDD) panel or a plasma display panel (PDP) may be selected, but the present disclosure is not limited thereto.

Figure 1:
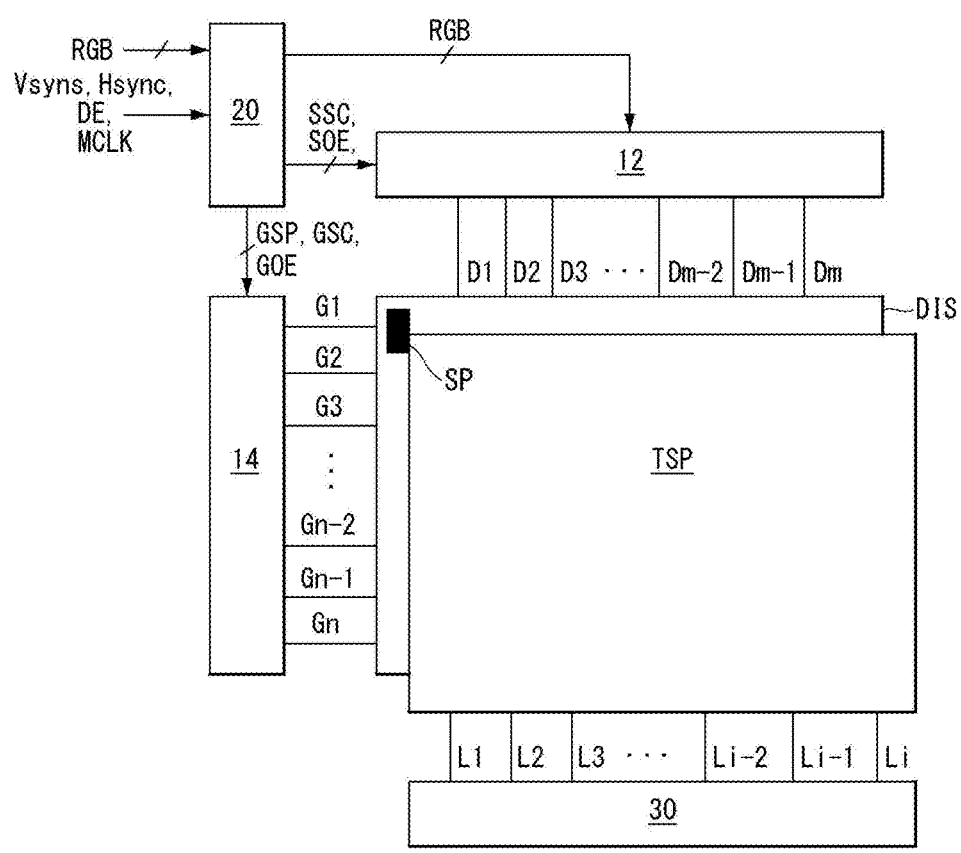
FIG. 1 is a block diagram schematically illustrating a configuration of a display device with a touchscreen, according to one embodiment.
Figure 2:
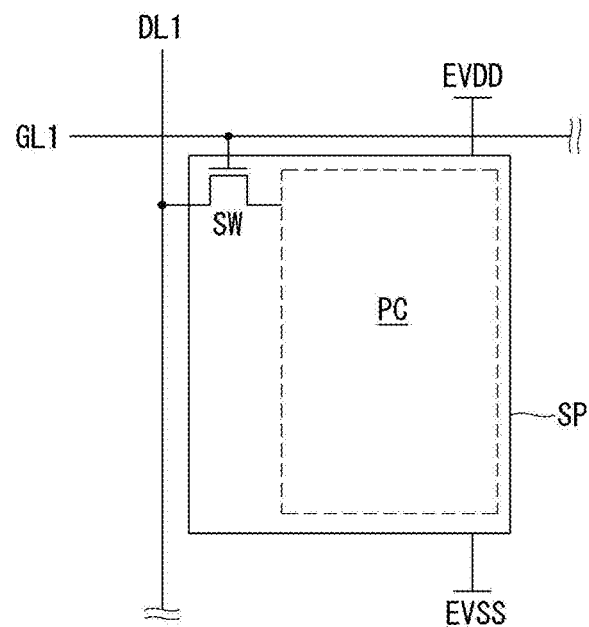
FIG. 2 is a circuit diagram illustrating a configuration of a sub-pixel shown in FIG. 1, according to one embodiment.

FIG. 1 is a block diagram schematically illustrating a configuration of a display device with a touchscreen, according to one embodiment. FIG. 2 is a circuit diagram illustrating a configuration of a sub-pixel shown in FIG. 1, according to one embodiment.

As illustrated in FIG. 1, the display device includes a timing controller 20, a data driving circuit 12, a scan driving circuit 14, a display panel DIS, a touchscreen TSP, a touchscreen driving circuit 30, and a touch controller 40.

The timing controller 20 controls the data driving circuit 12 and the scan driving circuit 14. The timing controller 20 receives timing signals and digital video data RGB from a host circuit (not shown). The timing signals include a vertical synchronization signal Vsync, a horizontal synchronization signal Hsync, a data enable signal DE, and a main clock MCLK. The timing controller 20 controls the scan driving circuit 14 based on scan timing control signals such as a gate start pulse GSP, a gate shift clock GSC, and a gate output enable signal GOE. The timing controller controls the data driving circuit 12 based on data timing control signals such as a source sampling clock SSC and a source output enable signal SOE. The timing controller 20 may be embodied in the form of an integrated circuit (IC).

The data driving circuit 12 converts the digital video data RGB received from the timing controller 20 into an analog data voltage. The data driving circuit 12 supplies the data voltage to data lines D1 to Dm on the display panel DIS. The data driving circuit 12 may be embodiment in the form of an IC.

The scan driving circuit 14 sequentially generates scan signals (or gate signals) synchronizing with the data voltage. The scan driving circuit 14 supplies the scan signals to gate lines G1 to Gn on the display panel DIS. The scan driving circuit 14 outputs, as the scan signal, a gate-high voltage to turn on a switching transistor included in each sub-pixel of the display panel DIS and a gate-low voltage to turn off the switching transistor. The scan driving circuit 14 may include a level shifter and a shift register. The level shifter may be embodied as a separate IC. The shift register may be embodied in a non-display area of the display panel DIS. Such a shift register embodied in the non-display area may also be referred to as a "gate-in-panel." This will be described later in more detail with reference to FIGS. 3 to 5.

The touchscreen driving circuit 30 senses whether or not touch has been generated and a touch position, using the touchscreen TSP. The touchscreen driving circuit 30 may include a driving circuit configured to generate a driving voltage for driving a touch sensor, and a sensing circuit configured to sense the driven touch sensor and to generate data for detecting whether or not touch has been generated, and coordinate information, etc. The driving circuit and the sensing circuit of the touchscreen driving circuit 30 may be integrated in the form of a single IC or may be separated from each other to be distinguished from each other in terms of functions. The touchscreen driving circuit 30 may be formed on an external substrate connected to the display panel DIS. The touchscreen driving circuit 30 is connected to the touchscreen TSP through sensing lines L1 to Li (i being a positive integer). The touchscreen driving circuit 30 may sense whether or not touch has been generated and a touch position, based on a capacity deviation among touch sensors formed at the touchscreen TSP, and may generate touch data according to sensed results.

The touchscreen TSP includes touch electrodes capable of sensing a position at which a finger of the user, a pen, or the like has touched the touchscreen TSP. The touchscreen TSP may be disposed inside or outside the display panel DIS. The touch electrodes of the touchscreen TSP are connected to the touchscreen driving circuit 20 through the sensing lines L1 to Li.

The display panel DIS displays an image based on scan signals supplied from the scan driving circuit 14 and data voltage supplied from the data driving circuit 12. The display panel DIS includes sub-pixels SP formed on substrate. The sub-pixels are defined by data lines D1 to Dm (m being an integer of 2 or greater) and gate lines G1 to Gn (n being an integer of 2 or greater). For the display panel DIS, a display panel such as a liquid crystal display (LCD) panel, an organic light emitting display (OLED) panel, a quantum dot display (QDD) panel or a plasma display panel (PDP) may be selected, but the following description will be given in conjunction with an example in which an OLED panel is used.

When an OLED panel is selected for the display panel DIS, as illustrated in FIGS. 1 and 2, each sub-pixel SP includes a pixel circuit PC and an organic light emitting diode, the pixel circuit PC includes a switching transistor SW, a driving transistor and a storage capacitor, to operate the organic light emitting diode based on the scan signal, the data voltage and driving voltages EVDD and EVSS. Each sub-pixel SP of the OLED panel directly emits light and, as such, has a complex circuit configuration, as compared to those of other display devices. Furthermore, a compensation circuit, which is configured to compensate for degradation of the organic light emitting diode and the driving transistor to supply driving current to the organic light emitting diode, or the like, is complex and diverse. In this regard, for simplicity of illustration, the pixel circuit PC included in each sub-pixel SP is shown in the form of a block.

Figure 3:
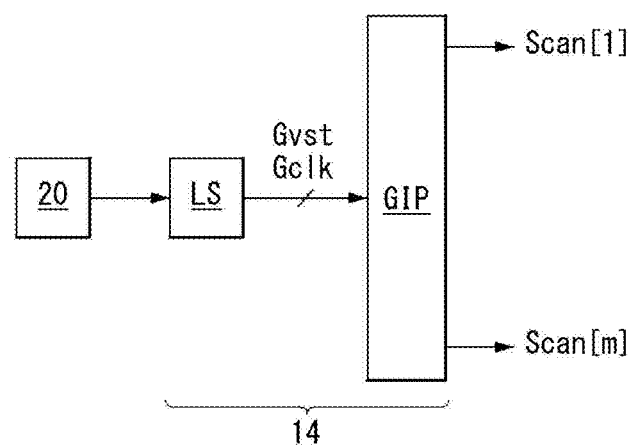
FIG. 3 is a block diagram illustrating a first configuration of a device associated with a gate-in-panel type scan driving circuit, according to one embodiment.
Figure 4:
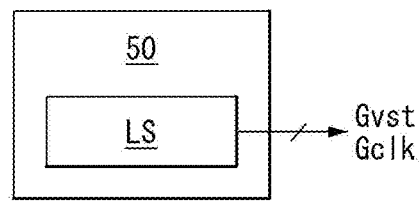
FIG. 4 is a block diagram illustrating a second configuration of the device associated with the gate-in-panel type driving circuit, according to one embodiment.
Figure 5:
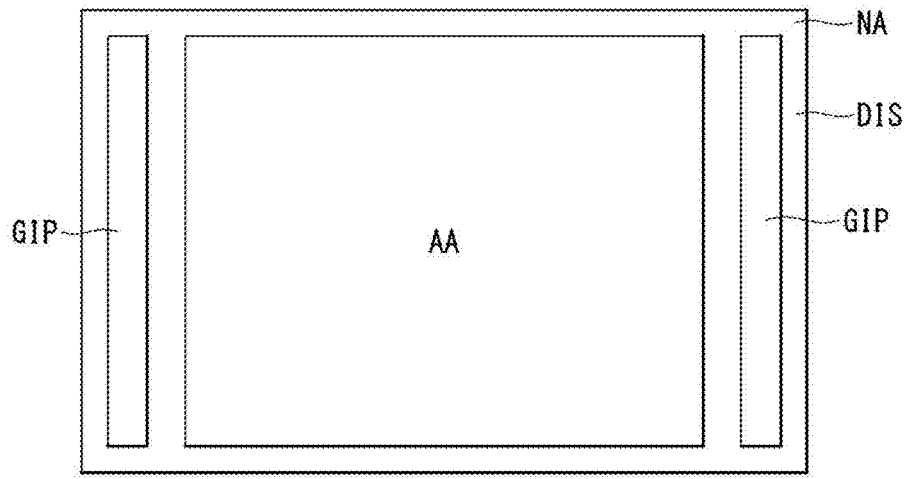
FIG. 5 is a view illustrating an example of arrangement of a shift register associated with the gate-in-panel type driving circuit, according to one embodiment.

FIG. 3 is a block diagram illustrating a first configuration of a device associated with a gate-in-panel type scan driving circuit, according to one embodiment. FIG. 4 is a block diagram illustrating a second configuration of the device associated with the gate-in-panel type driving circuit, according to one embodiment. FIG. 5 is a view illustrating an example of arrangement of a shift register associated with the gate-in-panel type driving circuit, according to one embodiment.

As illustrated in FIG. 3, the scan driving circuit 14 of a gate-in-panel type may include a level shifter LS (or a clock signal and voltage generator), and a shift register GIP (a scan signal generator). The level shifter LS may generate and output a plurality of clock signals Gclk and a start signal Gvst based on signals output from the timing controller. The plurality of clock signals Gclk may be generated and output under the condition that the clock signals Gclk have different K-phases (K being an integer of 2 or greater) such as 2-phase, 4-phase, and 8-phase).

The shift register GIP may operate based on the clock signals Gclk and the start signal Gvst output from the level shifter LS, and may output scan signals Scan[1] to Scan[m] capable of turning on or off transistors formed in each of the pixel circuit PCs of the display panel. The shift register GIP is formed on the display panel in a gate-in-panel manner in the form of a thin film. Accordingly, a portion of the scan driving circuit 14 formed on the display panel may be the shift register GIP. The level shifter LS may be formed in the form of an IC, different from the shift register GIP. Accordingly, as illustrated in FIG. 3, the level shifter LS may be configured in the form of a separate IC. Alternatively, the level shifter LS may be included within another device 50 (for example, a power supply circuit), as illustrated in FIG. 4.

As illustrated in FIG. 5, the shift register GIP included in the gate-in-panel type scan driving circuit may be formed in a non-display area NA of the display panel DIS. The shift register GIP may be disposed in left and right non-display areas NA, or may be disposed in upper and lower non-display areas NA or any one thereof. That is, although the shift register GIP has been illustrated as being disposed in a pair at left and right sides of the display area AA or upper and lower sides of the display area AA, a single shift register GIP may be disposed at one of the left, right, upper, and lower sides of the display area AA.

Figure 6:
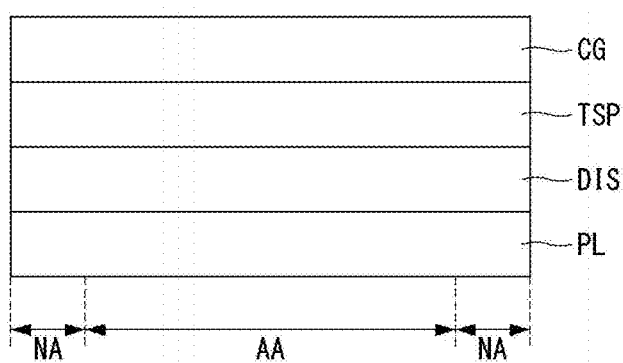
FIG. 6 is a view schematically illustrating a cross-sectional configuration of a display panel with a touchscreen according to a first embodiment of the present disclosure.
Figure 7:
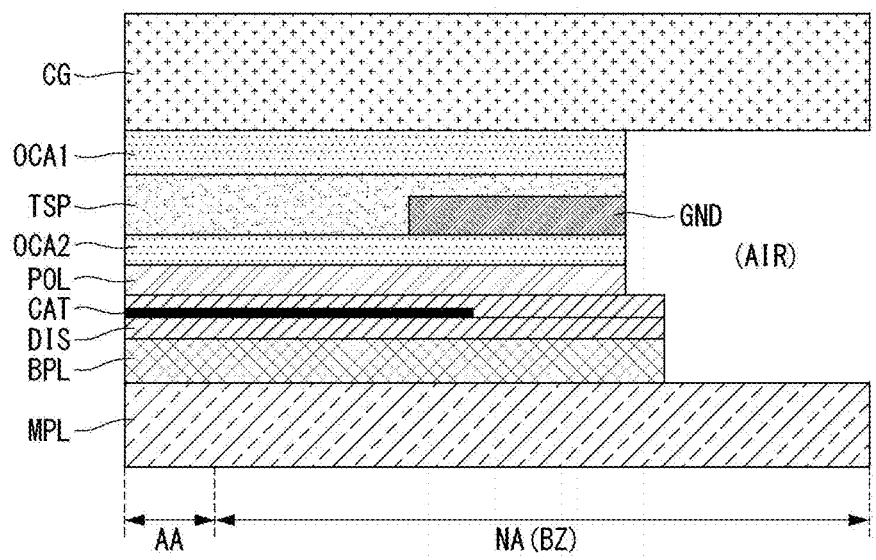
FIG. 7 is a view illustrating a portion of the cross-sectional configuration of the display panel with the touchscreen according to the first embodiment of the present disclosure in more detail.
Figure 8:
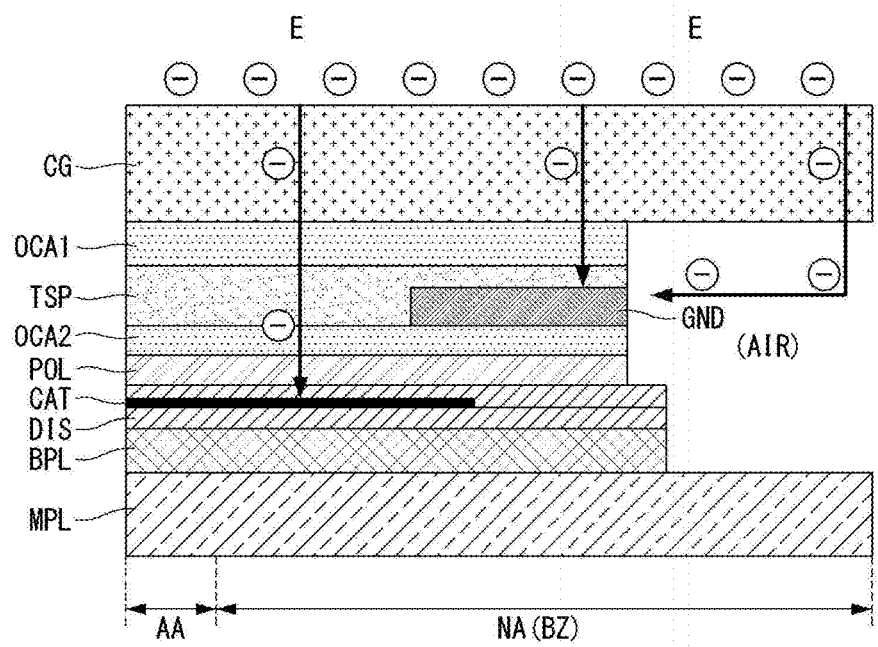
FIG. 8 is a view explaining effects of the display panel with the touchscreen illustrated in FIG. 7, according to one embodiment.

FIG. 6 is a view schematically illustrating a cross-sectional configuration of a display panel with a touchscreen according to a first embodiment of the present disclosure. FIG. 7 is a view illustrating a portion of the cross-sectional configuration of the display panel with the touchscreen according to the first embodiment of the present disclosure in more detail. FIG. 8 is a view explaining effects of the display panel with the touchscreen illustrated in FIG. 7, according to one embodiment.

As illustrated in FIG. 6, a touchscreen TSP may be disposed on one surface (e.g., upper surface) of a display panel DIS. A plate PL may be disposed under the other surface (e.g., lower surface) of the display panel DIS. A cover substrate CG may be disposed on the touchscreen TSP. The display panel DIS having the touchscreen TSP may receive an input such as touch of the user while displaying an image in a display area AA.

In the first embodiment illustrated in FIG. 7, plates BPL and MPL disposed under the display panel DIS may include a back plate BPL and a metal plate MPL. The back plate BPL may function to support the display panel DIS, whereas the metal plate MPL may function to secure rigidity together with the back plate BPL. The back plate BPL and the metal plate MPL may be omitted in accordance with the material of a substrate constituting the display panel DIS.

A first optically clear adhesive layer OCA1 may be disposed between the touchscreen TSP and the cover substrate CG. A second optically clear adhesive layer OCA2 and a polarization plate POL may be disposed between the touchscreen TSP and the display panel DIS. The cover substrate CG covers both the display area AA and the non-display area NA and, as such, a transparent material is selected for the cover substrate CG.

The metal plate MPL and the cover substrate CG are provided to protect the display panel DIS and the touchscreen TSP. Accordingly, the metal plate MPL and the cover substrate CG may have sizes greater than those of the back plate BPL, the display panel DIS, the polarization plate POL, the second optically clear adhesive layer OCA2, the touchscreen TSP and the first optically clear adhesive layer OCA1, without being limited thereto. Meanwhile, the metal plate MPL and the cover substrate CG are greater than other configurations, as illustrated in FIG. 7, and, as such, a space, through which air may flow, is present at an edge of the non-display area NA.

A common electrode covering all sub-pixels included in the display area AA is disposed in the display panel DIS. The common electrode is formed to occupy a large area such that the common electrode is electrically connected to all sub-pixels of the display area AA and, is named accordingly. The common electrode may be selected as anodes or cathodes of organic light emitting diodes included in the sub-pixels. However, the present disclosure will be described in conjunction with, for example, a cathode layer CAT. The cathode layer CAT may be formed on the display area AA and the non-display area NA. The cathode layer CAT may be formed even in an area adjacent to a periphery of the display panel DIS.

The touchscreen TSP may include touch sensors disposed in the display area AA and a touch ground layer GND disposed in the non-display area NA. The touch ground layer GND of the touchscreen TSP may be disposed adjacent to the cathode layer which is the common electrode of the display panel DIS. The touch ground layer GND may be disposed at four sides surrounding the display area AA, or may be disposed to correspond to the shift register GIP disposed in the non-display area NA. Accordingly, the touch ground layer GND may be defined as a ground line in accordance with the disposition size thereof or the area occupied thereby.

As seen from FIG. 8, in the first embodiment of the present disclosure, the touch ground layer GND of the touchscreen TSP and the cathode layer CAT of the display panel DIS are disposed adjacent to each other and, as such, a static electricity path capable of discharging static electricity accumulated on a surface of the cover substrate CG may be formed. As a result, even when static electricity is generated at the surface of the cover substrate CG, the static electricity may be discharged through the static electricity path constituted by the touch ground layer GND of the touchscreen TSP and the cathode layer CAT of the display panel DIS.

As apparent from the above description, the first embodiment of the present disclosure has the static electricity path constituted by the touch ground layer GND and the cathode layer CAT and, as such, static electricity formed at the surface of the cover substrate CG may be easily discharged.

Figure 9:
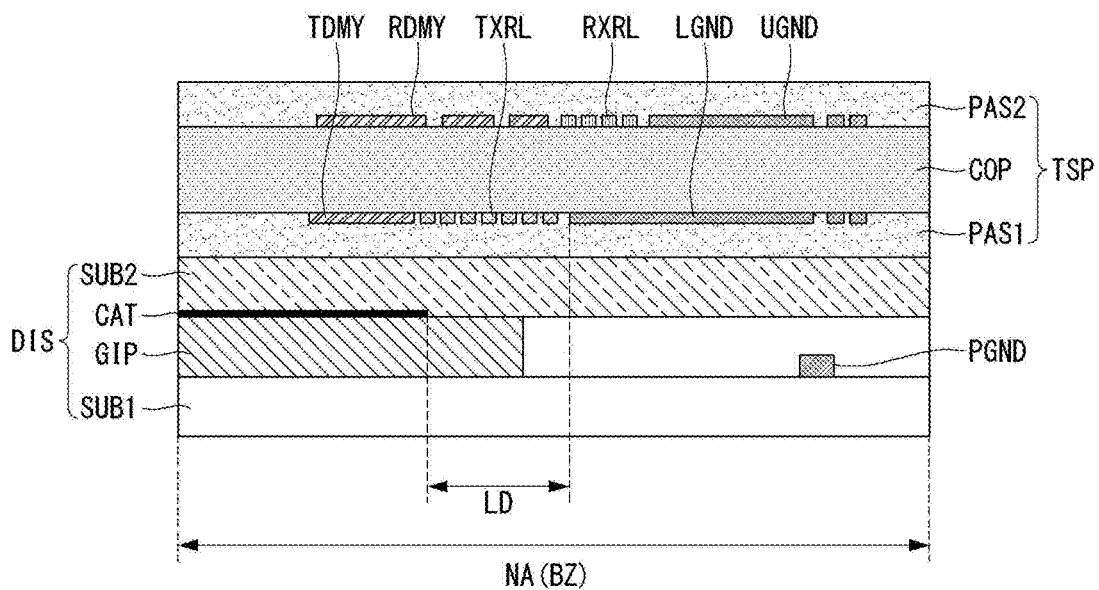
FIG. 9 is a view illustrating a portion of a cross-sectional configuration of a display panel with a touchscreen according to a second embodiment of the present disclosure in more detail.
Figure 10:
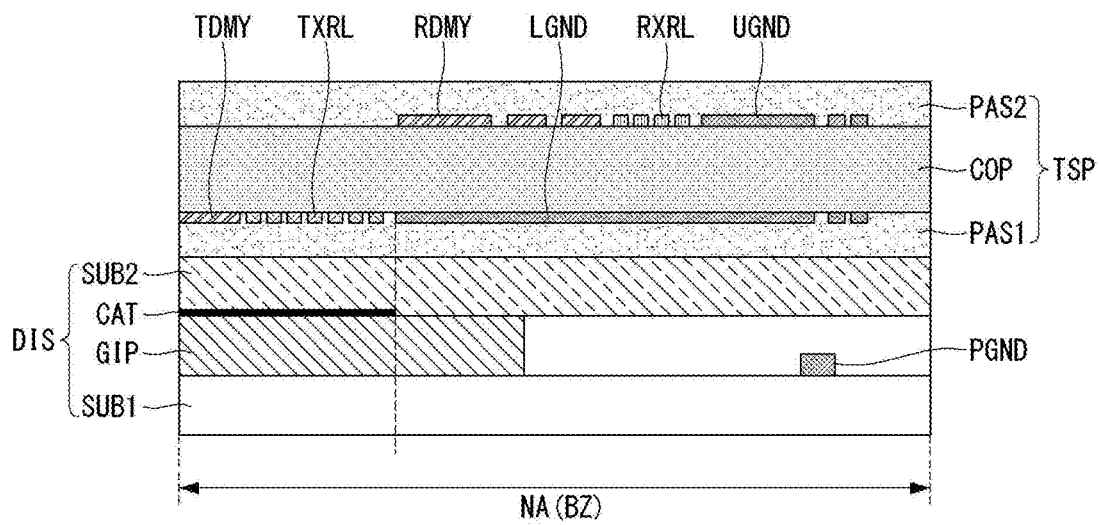
FIG. 10 is a view illustrating a portion of a cross-sectional configuration of a display panel with a touchscreen according to a third embodiment of the present disclosure in more detail.
Figure 11:
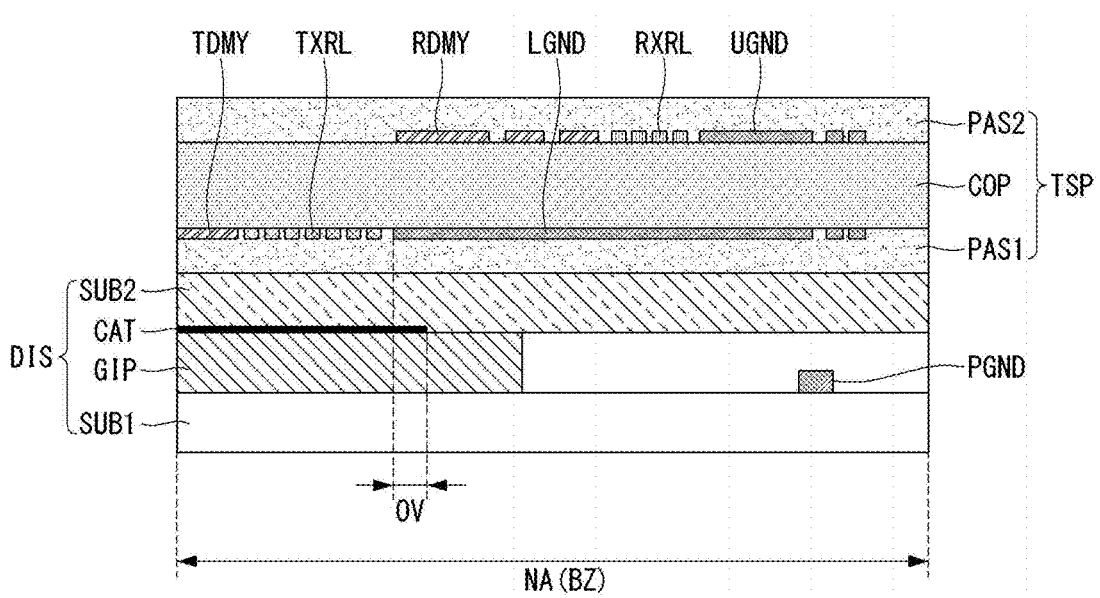
FIG. 11 is a view illustrating a portion of a cross-sectional configuration of a display panel with a touchscreen according to a fourth embodiment of the present disclosure in more detail.

FIG. 9 is a view illustrating a portion of a cross-sectional configuration of a display panel with a touchscreen according to a second embodiment of the present disclosure in more detail. FIG. 10 is a view illustrating a portion of a cross-sectional configuration of a display panel with a touchscreen according to a third embodiment of the present disclosure in more detail. FIG. 11 is a view illustrating a portion of a cross-sectional configuration of a display panel with a touchscreen according to a fourth embodiment of the present disclosure in more detail.

In the second embodiment illustrated in FIG. 9, a display panel DIS may include a lower substrate SUB1 and an upper substrate SUB2. A shift register GIP may be disposed in a non-display area NA of the lower substrate SUB1, which is adjacent to a display area of the lower substrate SUB1. A panel ground layer PGND may be disposed at a periphery of the non-display area NA of the display panel DIS adjacent to the shift register GIP. In addition, a cathode layer CAT, which is a common electrode of the display panel DIS, may be disposed on an insulating layer covering the shift register GIP.

A touchscreen TSP may include a base layer COP, a first passivation layer PAS1, and a second passivation layer PAS2. The first passivation layer PAS1 and the second passivation layer PAS2 cover an upper surface and a lower surface of the base layer COP, respectively. The first passivation layer PAS1 and the second passivation layer PAS2 serve to protect layers formed at the opposite surfaces of the base layer COP.

A first dummy touch electrode layer RDMY, a first touch routing electrode layer RXRL, and a first touch ground layer UGND may be disposed on the upper surface of the base layer COP. A second dummy touch electrode layer TDMY, a second touch routing electrode layer TXRL, and a second touch ground layer LGND may be disposed on the lower surface of the base layer COP.

The first dummy touch electrode layer RDMY and the second dummy touch electrode layer TDMY are disposed adjacent to the display area AA. The first touch ground layer UGND and the second touch ground layer LGND are disposed at the periphery of the non-display area NA. The first touch routing electrode layer RXRL is disposed between the first dummy touch electrode layer RDMY and the first touch ground layer UGND. The second touch routing electrode layer TXRL is disposed between the second dummy touch electrode layer TDMY and the second touch ground layer LGND.

At least one of the first touch ground layer UGND and the second touch ground layer LGND may be disposed to be spaced apart from the cathode layer CAT by a distance LD. At least one of the first touch ground layer UGND and the second touch ground layer LGND may have a greater width than a width of the panel ground layer PGND. At least one of the first touch ground layer UGND and the second touch ground layer LGND may be disposed adjacent to the panel ground layer PGND or may be disposed to overlap with the panel ground layer PGND at a portion thereof.

In the second embodiment of the present disclosure as described above, the first touch ground layer UGND of the touchscreen TSP, the second touch ground layer LGND of the touchscreen TSP, the cathode layer CAT of the display panel DIS, and the panel ground layer PGND of the display panel DIS constitute a static electricity path. Since the second embodiment of the present disclosure has the static electricity path constituted by the first touch ground layer UGND, the second touch ground layer LGND, the panel ground layer PGND, and the cathode layer CAT, it may be possible to more effectively avoid a problem of diffusion or induction of electric charges into a horizontal interface of the cover substrate CG or a vertical interface between the cover substrate CG and the metal plate MPL.

Meanwhile, the non-display area NA is mainly illustrated in FIG. 9, and the first touch electrode layer and the second touch electrode layer (electrode layers constituting the touchscreen) connected to the first touch routing electrode layer RXRL and the second touch routing electrode layer TXRL are omitted from FIG. 9. In addition, although positions, numbers and widths of the first dummy touch electrode layer RDMY, the first touch routing electrode layer RXRL, the first touch ground layer UGND, the second dummy touch electrode layer TDMY, the second touch routing electrode layer TXRL and the second touch ground layer LGND may be equal, there may be differences among the positions, numbers and widths in accordance with a given design or an intended purpose, as shown in FIG. 9. This will be described in conjunction with the following embodiments.

In the third embodiment illustrated in FIG. 10, a display panel DIS may include a lower substrate SUB1, an upper substrate SUB2, and a shift register GIP and a panel ground layer PGND which are disposed on a non-display area NA between the lower substrate SUB1 and the upper substrate SUB2. The display panel DIS may also include a cathode layer CAT disposed on an insulating layer covering the shift register GIP.

A touchscreen TSP may include a base layer COP, a first passivation layer PAS1, and a second passivation layer PAS2. The base layer COP may include a first dummy touch electrode layer RDMY, a first touch routing electrode layer RXRL and a first touch ground layer UGND which are disposed on one surface of the base layer COP. The base layer COP may also include a second dummy touch electrode layer TDMY, a second touch routing electrode layer TXRL and a second touch ground layer LGND which are disposed on the other surface of the base layer COP.

The third embodiment of the present disclosure is similar or identical to the second embodiment in that the first touch ground layer UGND of the touchscreen TSP, the second touch ground layer LGND of the touchscreen TSP, the cathode layer CAT of the display panel DIS, and the panel ground layer PGND of the display panel DIS constitute a static electricity path. Accordingly, the second touch ground layer LGND may have a greater width than a width of the first touch ground layer UGND. At least one of the first touch ground layer UGND and the second touch ground layer LGND may be disposed adjacent to the panel ground layer PGND or may be disposed to overlap with the panel ground layer PGND at a portion thereof.

However, the third embodiment of the present disclosure differs from the second embodiment in that, when viewed in a vertical cross-section, one end of the cathode layer CAT (a portion extending to the non-display area) and one end of the second touch ground layer LGND (a portion disposed adjacent to the display area) are disposed to face each other (to be aligned with each other). In order to obtain such a structure, the third embodiment of the present disclosure may use a method of extending one end of the second touch ground layer LGND to one end of the cathode layer CAT.

Since the third embodiment of the present disclosure as described above has a static electricity path constituted by the first touch ground layer UGND, the second touch ground layer LGND, the panel ground layer PGND, and the cathode layer CAT, it may be possible to more effectively avoid a problem of diffusion or induction of electric charges into a horizontal interface of the cover substrate CG or a vertical interface between the cover substrate CG and the metal plate MPL.

In the fourth embodiment illustrated in FIG. 11, a display panel DIS may include a lower substrate SUB1, an upper substrate SUB2, and a shift register GIP, and a panel ground layer PGND which are disposed on a non-display area NA between the lower substrate SUB1 and the upper substrate SUB2. The display panel DIS may also include a cathode layer CAT disposed on an insulating layer covering the shift register GIP.

A touchscreen TSP may include a base layer COP, a first passivation layer PAS1, and a second passivation layer PAS2. The base layer COP may include a first dummy touch electrode layer RDMY, a first touch routing electrode layer RXRL, and a first touch ground layer UGND which are disposed on one surface of the base layer COP. The base layer COP may also include a second dummy touch electrode layer TDMY, a second touch routing electrode layer TXRL, and a second touch ground layer LGND which are disposed on the other surface of the base layer COP.

The fourth embodiment of the present disclosure is similar or identical to the second embodiment in that the first touch ground layer UGND of the touchscreen TSP, the second touch ground layer LGND of the touchscreen TSP, the cathode layer CAT of the display panel DIS, and the panel ground layer PGND of the display panel DIS constitute a static electricity path. Accordingly, the second touch ground layer LGND may have a greater width than the first touch ground layer UGND. At least one of the first touch ground layer UGND or the second touch ground layer LGND may be disposed adjacent to the panel ground layer PGND or may be disposed to overlap with the panel ground layer PGND at a portion thereof.

However, the fourth embodiment of the present disclosure differs from the second embodiment in that, when viewed in a vertical cross-section, one end of the cathode layer CAT (a portion extending to the non-display area) and one end of the second touch ground layer LGND (a portion disposed adjacent to the display area) are disposed to overlap with each other (OV). In order to obtain such a structure, the fourth embodiment of the present disclosure may use a method of extending one end of the second touch ground layer LGND to a portion of the cathode layer CAT.

Since the fourth embodiment of the present disclosure as described above has a static electricity path constituted by the first touch ground layer UGND, the second touch ground layer LGND, the panel ground layer PGND, and the cathode layer CAT, it may be possible to more effectively avoid a problem of diffusion or induction of electric charges into a horizontal interface of the cover substrate CG or a vertical interface between the cover substrate CG and the metal plate MPL.

Hereinafter, embodiments different from the second to fourth embodiments will be described.

Figure 12:
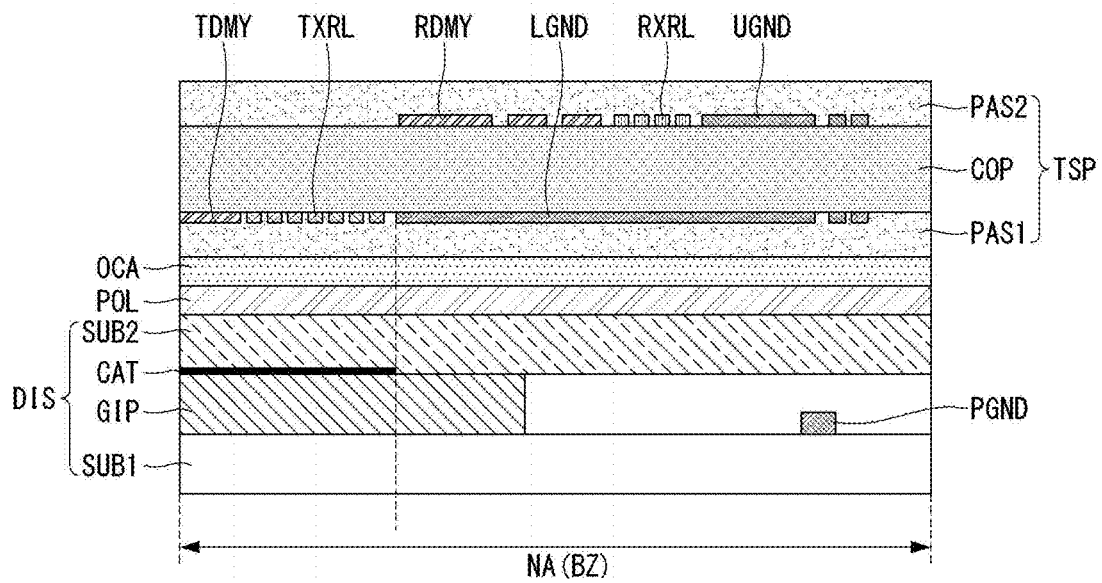
FIG. 12 is a view illustrating a portion of a cross-sectional configuration of a display panel with a touchscreen according to a fifth embodiment of the present disclosure in more detail.
Figure 13:
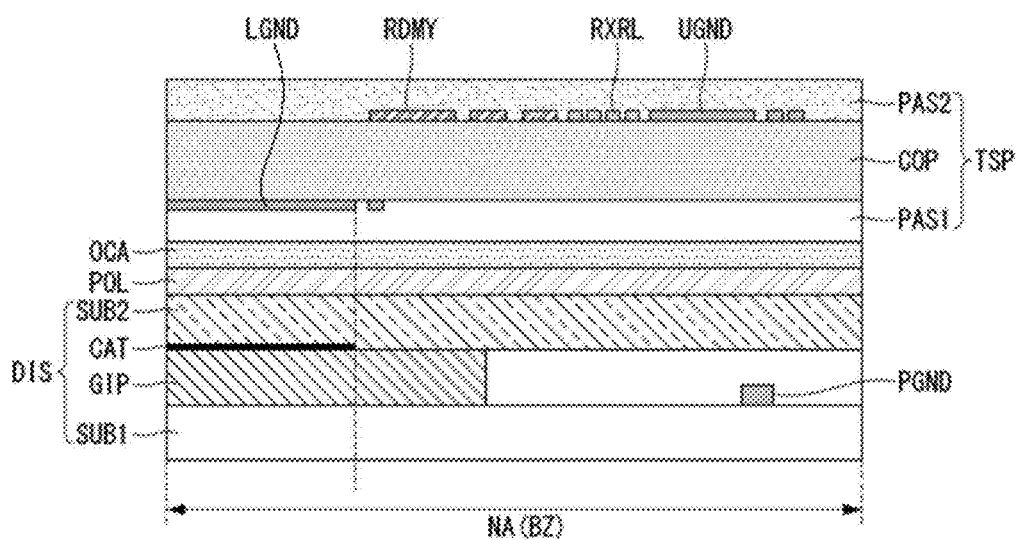
FIG. 13 is a view illustrating a portion of a cross-sectional configuration of a display panel with a touchscreen according to a sixth embodiment of the present disclosure in more detail.

FIG. 12 is a view illustrating a portion of a cross-sectional configuration of a display panel with a touchscreen according to a fifth embodiment of the present disclosure in more detail. FIG. 13 is a view illustrating a portion of a cross-sectional configuration of a display panel with a touchscreen according to a sixth embodiment of the present disclosure in more detail.

In the fifth embodiment illustrated in FIG. 12, a display panel DIS may include a lower substrate SUB1, an upper substrate SUB2, and a shift register GIP and a panel ground layer PGND which are disposed in a non-display area NA between the lower substrate SUB1 and the upper substrate SUB2. The display panel DIS may also include a cathode layer CAT disposed on an insulating layer covering the shift register GIP.

A touchscreen TSP may include a base layer COP, a first passivation layer PAS1, and a second passivation layer PAS2. The base layer COP may include a first dummy touch electrode layer RDMY, a first touch routing electrode layer RXRL and a first touch ground layer UGND which are disposed on one surface of the base layer COP. The base layer COP may also include a second dummy touch electrode layer TDMY, a second touch routing electrode layer TXRL and a second touch ground layer LGND which are disposed on the other surface of the base layer COP.

A polarization plate POL and a optically clear adhesive layer OCA may be disposed between the display panel DIS and the touchscreen TSP. The polarization plate POL may be attached to one surface (upper surface) of the display panel DIS, whereas the optically clear adhesive layer OCA may be attached to one surface (upper surface) of the polarization plate POL and the other surface (lower surface) of the touchscreen TSP.

Meanwhile, although the fifth embodiment of the present disclosure has a structure in which the polarization plate POL and the optically clear adhesive layer OCA are disposed between the display panel DIS and the touchscreen TSP, a configuration constituting a static electricity path in the fifth embodiment is similar or identical to that of the third embodiment of FIG. 10. Accordingly, the second touch ground layer LGND may have a greater width than a width of the first touch ground layer UGND. At least one of the first touch ground layer UGND and the second touch ground layer LGND may be disposed adjacent to the panel ground layer PGND or may be disposed to overlap with the panel ground layer PGND at a portion thereof.

In addition, when viewed in a vertical cross-section, one end of the cathode layer CAT (a portion extending to the non-display area) and one end of the second touch ground layer LGND (a portion disposed adjacent to the display area) are disposed to face each other (to be aligned with each other). Of course, this is only illustrative. A static electricity path may be configured in the same manner as the second embodiment or the fourth embodiment.

Since the fifth embodiment of the present disclosure as described above has a static electricity path constituted by the first touch ground layer UGND, the second touch ground layer LGND, the panel ground layer PGND, and the cathode layer CAT, it may be possible to more effectively avoid a problem of diffusion or induction of electric charges into a horizontal interface of the cover substrate CG or a vertical interface between the cover substrate CG and the metal plate MPL.

In the sixth embodiment illustrated in FIG. 13, a display panel DIS may include a lower substrate SUB1, an upper substrate SUB2, and a shift register GIP and a panel ground layer PGND which are disposed on a non-display area NA between the lower substrate SUB1 and the upper substrate SUB2. The display panel DIS may also include a cathode layer CAT disposed on an insulating layer covering the shift register GIP.

A touchscreen TSP may include a base layer COP, a first passivation layer PAS1, and a second passivation layer PAS2. The base layer COP may include a first dummy touch electrode layer RDMY, a first touch routing electrode layer RXRL, and a first touch ground layer UGND which are disposed on one surface of the base layer COP. The base layer COP may also include a second touch ground layer LGND disposed on the other surface of the base layer COP.

A polarization plate POL and a optically clear adhesive layer OCA may be disposed between the display panel DIS and the touchscreen TSP. The polarization plate POL may be attached to one surface (upper surface) of the display panel DIS, whereas the optically clear adhesive layer OCA may be attached to one surface (upper surface) of the polarization plate POL and the other surface (lower surface) of the touchscreen TSP.

Meanwhile, although the sixth embodiment of the present disclosure has a structure in which the polarization plate POL and the optically clear adhesive layer OCA are disposed between the display panel DIS and the touchscreen TSP, as in the fifth embodiment, the sixth embodiment differs from the fifth embodiment in terms of disposition of the second touch ground layer LGND constituting a static electricity path. As illustrated in FIG. 13, the second touch ground layer LGND may be disposed to overlap with the cathode layer CAT at partially or all portions thereof. The second touch ground layer LGND may have a width equal to or greater than a width of the first touch ground layer UGND.

In order to obtain such a structure, the sixth embodiment of the present disclosure may use a method of shifting the second touch ground layer LGND to the cathode layer CAT. In addition, it may be possible to constitute a touch electrode only by a single electrode layer disposed on one surface of the base layer COP without constituting the touch electrode by two electrode layers disposed at opposite surfaces of the base layer COP. Thus, this is only illustrative. For example, two electrode layers may be used. In this case, it may be possible to use a method of shifting only the second touch ground layer LGND to the cathode layer CAT under the condition that the second dummy touch electrode layer (not shown) and the second touch routing electrode layer (not shown) are maintained.

Since the sixth embodiment of the present disclosure as described above has a static electricity path constituted by the first touch ground layer UGND, the second touch ground layer LGND, the panel ground layer PGND, and the cathode layer CAT, it may be possible to more effectively avoid a problem of diffusion or induction of electric charges into a horizontal interface of the cover substrate CG or a vertical interface between the cover substrate CG and the metal plate MPL. Meanwhile, the sixth embodiment illustrates an example in which the second touch ground layer LGND is disposed to overlap with the cathode layer CAT at some or all portions thereof. However, the second touch ground layer LGND may be partially disposed in the non-display area NA such that the second touch ground layer LGND does not overlap with the panel ground layer PGND.

Figure 14:
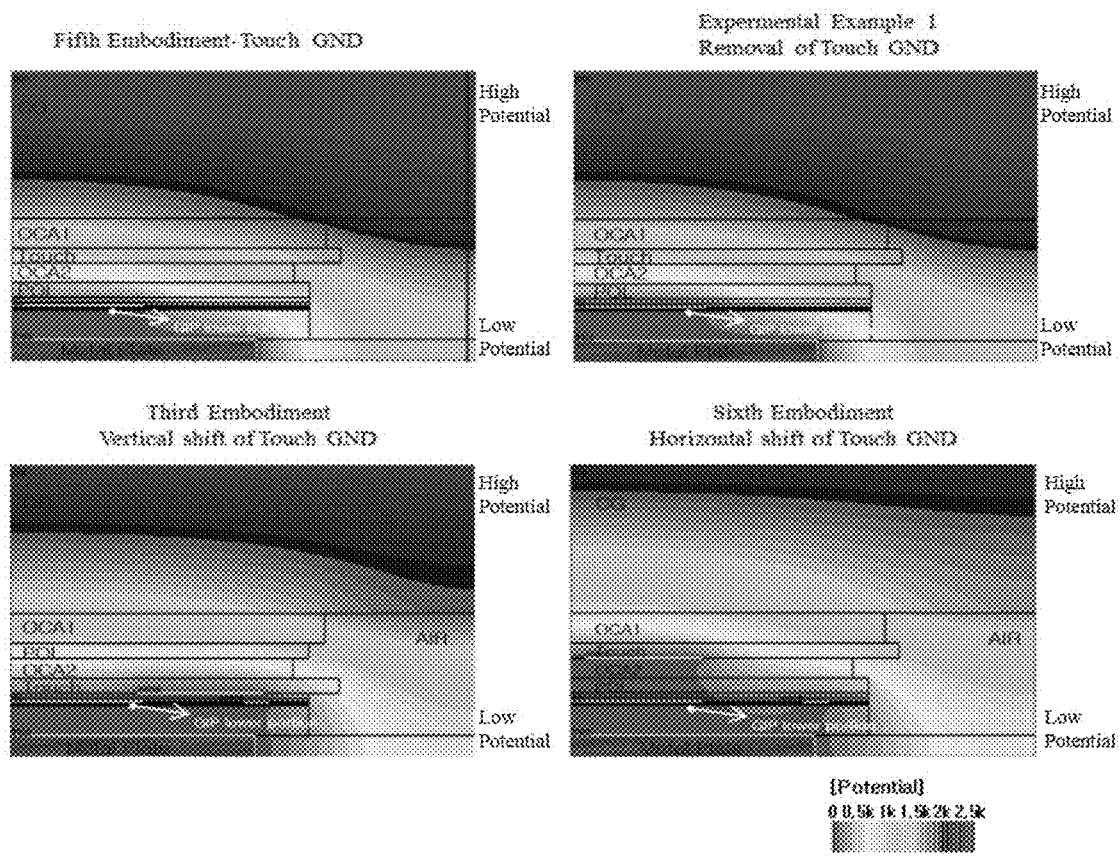
FIG. 14 shows diagrams of potential distribution exhibited in three selected ones of the above-described embodiments and an experimental example in accordance with different structures thereof when static electricity is applied, according to one embodiment.
Figures 15, 16:
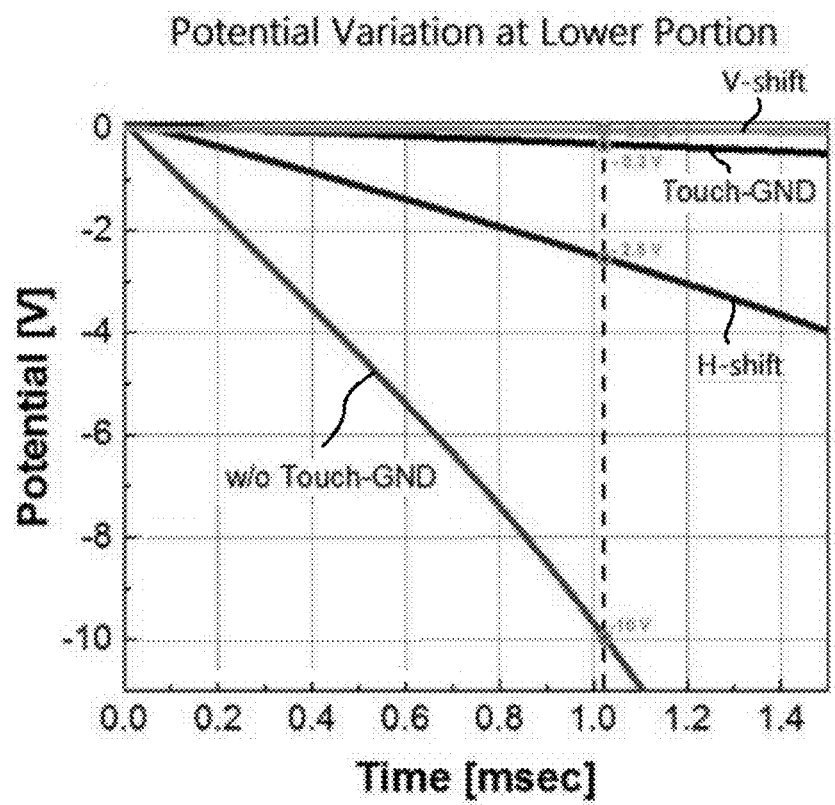
FIG. 15 shows graphs of potential variations exhibited at lower portions of shift registers in the samples shown in FIG. 14, according to one embodiment.
FIG. 16 is a potential variation table based on the graphs shown in FIG. 15, according to one embodiment.

FIG. 14 shows diagrams of potential distribution exhibited in three selected ones of the above-described embodiments and an experimental example in accordance with different structures thereof when static electricity is applied, according to one embodiment. FIG. 15 shows graphs of potential variations exhibited at lower portions of shift registers in the samples shown in FIG. 14, according to one embodiment. FIG. 16 is a potential variation table based on the graphs shown in FIG. 15, according to one embodiment.

A simulation was conducted to identify potential distribution that can be exhibited when static electricity is applied to a cover substrate in each of different structures of the third embodiment, the fifth embodiment, the sixth embodiment and an experimental example 1, as shown in FIG. 14. The experimental example 1 has a structure in which there is only a cathode layer without a ground layer (removal of Touch GND or without (w/o) Touch-GND). Since the structures of the third embodiment, the fifth embodiment and the sixth embodiment have been described above, for description thereof refer to FIGS. 10, 12, and 13. In addition, "Touch GND" or "Touch-GND" described in FIGS. 14 to 16 represents a second touch ground layer disposed at a layer near the cathode layer.

In addition, to the third embodiment, the fifth embodiment, the sixth embodiment and the experimental example 1, an example in which a plastic material such as polyimide (PI) is selected for at least one of two substrates constituting a display panel is applied. This is because a plastic material such as polyimide (PI) is weaker against static electricity than a material such as glass.

As shown in FIGS. 14 to 16, the experimental example 1 exhibits higher potential at the lower portion of the shift register GIP than the third embodiment, the fifth embodiment, and the sixth embodiment because there is no static electricity path capable of easily discharging static electricity in experimental example 1. On the other hand, the third embodiment, the fifth embodiment, and the sixth embodiment exhibit lower potential at the lower portion of the shift register GIP than the experimental example 1 because there is a static electricity path capable of easily discharging static electricity in each of the third embodiment, the fifth embodiment, and the sixth embodiment.

In addition, as seen from the simulation, all of the third embodiment, the fifth embodiment, and the sixth embodiment can avoid a problem of an increase in potential at the lower portion of the shift register GIP. However, the third embodiment and the fifth embodiment exhibit superior performance to the sixth embodiment.

Meanwhile, when it is impossible to easily discharge static electricity, electrical properties at the edge of the display panel (non-display area) may be varied. As a result, screen abnormality (a phenomenon that discoloration of the screen into a particular color, for example, a color having a bluish tint, occurs) may occur. This is because various problems such as migration or diffusion of charges of static electricity or collapse of charge neutrality balance caused by a diffused electric field may occur. A screen abnormality occurrence mechanism may be caused by drift of negative electric charges and discharge of negative electric charges into air. This will be described hereinafter.

Figure 17A:
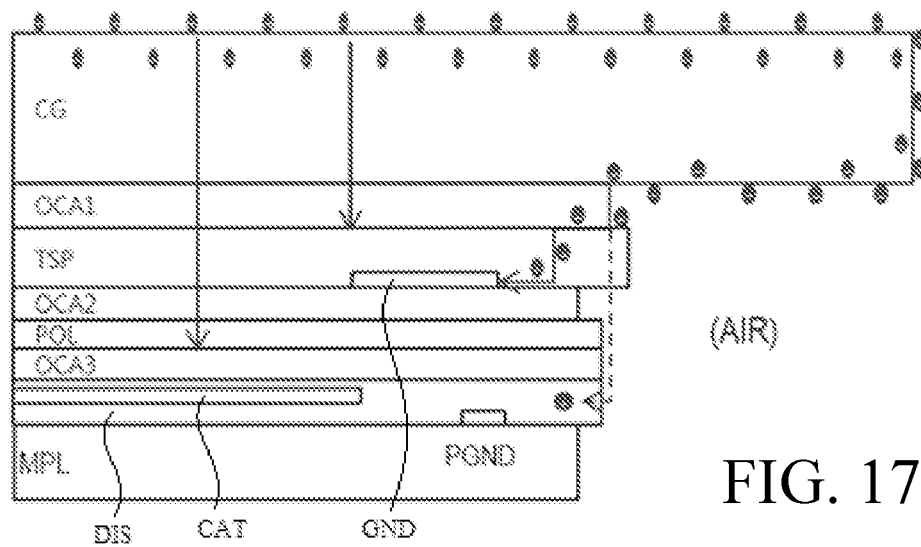
FIGS. 17A and 17B is a view explaining drift of negative electric charges and a mechanism thereof.
Figure 17B:
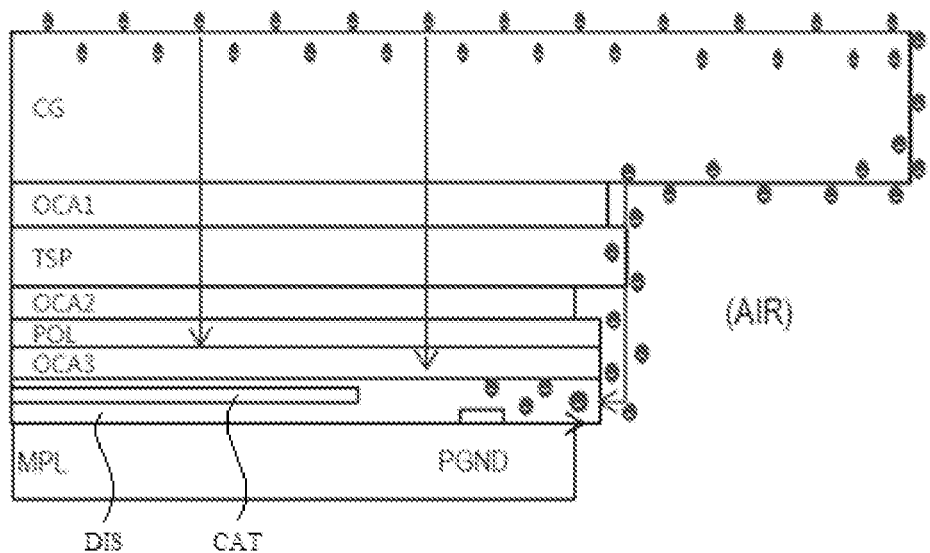

FIGS. 17A and 17B is a view explaining drift of negative electric charges and a mechanism thereof. Although an example in which a third optically clear adhesive layer OCA3 is disposed between the display panel DIS and the polarization plate POL is applied to the case of FIGS. 17A and 17B, the third optically clear adhesive layer OCA3 may be omitted in accordance with the structure of the polarization plate POL.

When friction is applied to the cover substrate CG, for application of static electricity, the cover substrate CG is charged with negative electric charges (−). When this situation is continued, the cover substrate CG becomes a negative electrode and, as such, may form electric flux density of a vertical electric field together with positive electric charges (+) in the display panel DIS. The negative electric charges (−) increasing in kinetic energy due to frictional heat migrate to the edge of the cover substrate CG, and may then drift to an inside of the display panel DIS along a surface of the cover substrate CG within the vertical electric field.

In an embodiment shown in FIG. 17A, there is a static electricity path including the touch ground layer GND of the touchscreen TSP, the cathode layer CAT of the display panel DIS, and the panel ground layer PGND of the display panel DIS. As a result, negative electric charges (−) charged in the cover substrate CG may drift to an inside of the display panel DIS via the touchscreen TSP due to influence of a vertical electric field. However, most negative electric charges (−) are discharged by the touch ground layer GND of the touchscreen TSP, and only a small quantity of negative electric charges (−) drifts to an inside of the display panel DIS. Accordingly, the problem of screen abnormality may be delayed or avoided.

In an experimental example shown in FIG. 17B, although the display panel DIS includes the cathode layer CAT and the panel ground layer PGND, a path capable of smoothly discharging static electricity is not formed. As a result, almost all negative charges (−) charged in the cover substrate CG may drift to an inside of the display panel DIS via the touchscreen TSP due to influence of a vertical electric field. Accordingly, electrical properties at an edge of the display panel (non-display area) may be varied and, as such, screen abnormality may occur or accelerate (deepen).

Figure 18A:
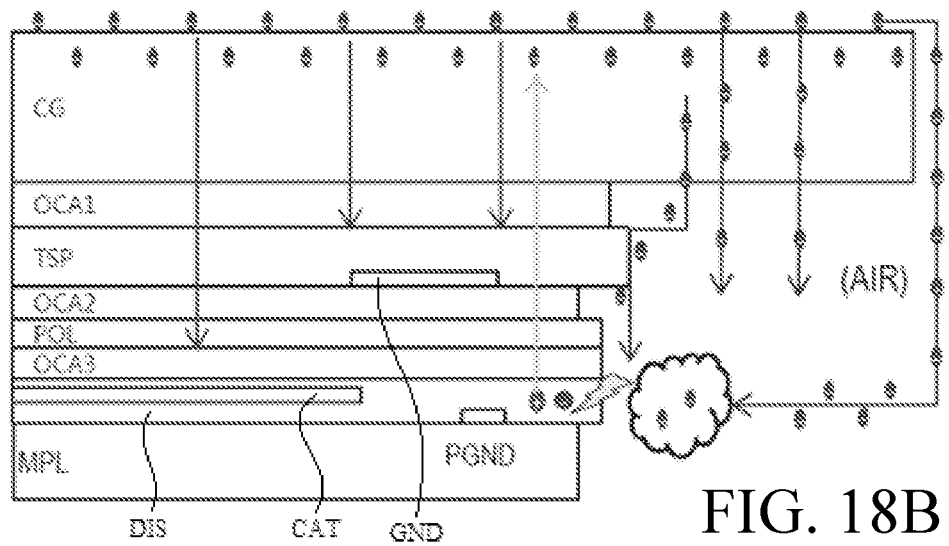
FIGS. 18A and 18B is a view explaining a mechanism of discharging negative electric charges into air.
Figure 18B:
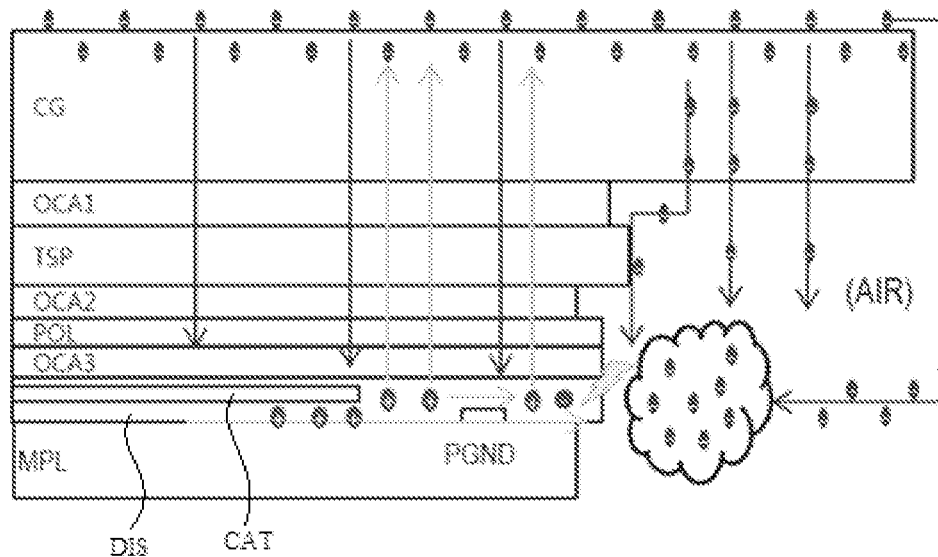

FIGS. 18A and 18B is a view explaining a mechanism of discharging negative electric charges into air. Meanwhile, although an example in which a third optically clear adhesive layer OCA3 is disposed between the display panel DIS and the polarization plate POL is applied to the case of FIGS. 18A and 18B, the third optically clear adhesive layer OCA3 may be omitted in accordance with the structure of the polarization plate POL.

When friction is applied to the cover substrate CG, for application of static electricity, the cover substrate CG is charged with negative electric charges (−). When this situation is continued, the cover substrate CG becomes a negative electrode and, as such, may form electric flux density of a vertical electric field together with positive electric charges (+) in the display panel DIS. The negative electric charges (−) increasing in kinetic energy due to frictional heat migrate to the edge of the cover substrate CG, and may then be induced to a side surface of the display panel DIS in accordance with irregular distribution of fringe effects in a vertical electric force field. The induced negative electric charges (−) may be continuously accumulated (in the form of wall electric charges and, as such, electrostatic potential in the inside of the display panel DIS may differ from electrostatic potential in the outside of the display panel DIS. As a result, negative electric charges (−) may be discharged into air.

In an embodiment shown in FIG. 18A, there is a static electricity path including the touch ground layer GND of the touchscreen TSP, the cathode layer CAT of the display panel DIS, and the panel ground layer PGND of the display panel DIS. As a result, most negative electric charges (−) may be discharged by the touch ground layer GND of the touchscreen TSP. In addition, although electric flux density is proportional to a quantity of electric charges, electric flux density may be shielded by the touch ground layer GND of the touchscreen TSP (reduced formation of an electric field) and, as such, the quantity of charges of static electricity induced by a force field may be reduced. Accordingly, the problem of screen abnormality may be delayed or avoided.

In an experimental example shown in FIG. 18B, although the display panel DIS includes the cathode layer CAT and the panel ground layer PGND, a path capable of smoothly discharging static electricity is not formed. As a result, almost all negative electric charges (−) charged in the cover substrate CG may not be discharged or shielded and, as such, a vertical electric field proportional to the quantity of electric charges may be formed. In addition, negative electric charges (−) induced to a side surface of the display panel DIS may be proportionally accumulated. Furthermore, negative electric charges (−) induced to the side surface of the display panel DIS may continuously form a path caused by attraction force together with positive electric charges (+) present therearound or may be discharged into air. As a result, screen abnormality may occur or accelerate.

As apparent from the above description, the present disclosure may suppress diffusion of electric charges to a circuit (a transistor constituting a shift register) on a lower substrate of a display panel on the basis of a structure capable of efficiently discharging static electricity accumulated on a surface of a cover substrate or a side surface of the cover substrate and, as such, may have an effect of avoiding quality degradation of a screen. In addition, the present disclosure may avoid a problem of induction or diffusion of electric charges into the circuit on the lower substrate of the display panel and, as such, may have an effect of minimizing or avoiding adverse influence on the circuit (malfunction, reliability degradation, drivability degradation, etc.).

Although the foregoing description has been given mainly in conjunction with embodiments, these embodiments are only illustrative without limiting the disclosure. Those skilled in the art to which the present disclosure pertains can appreciate that various modifications and applications illustrated in the foregoing description may be possible without changing essential characteristics of the embodiments. Therefore, the above-described embodiments should be understood as exemplary rather than limiting in all aspects. In addition, the scope of the present disclosure should also be interpreted by the claims below rather than the above detailed description. All modifications or alterations as would be derived from the equivalent concept intended to be included within the scope of the present disclosure should also be interpreted as falling within the scope of the disclosure.

What is claimed is:

1. A display device comprising:
    a display panel having an electrode layer in a display area and a non-display area, a shift register in a non-display area adjacent to the display area and overlapping with the electrode layer, and a panel ground layer at a periphery of the non-display area, the panel ground layer on a same layer as the shift register; and
    a touchscreen disposed over the display panel, the touchscreen including a touch ground layer having an area overlapping with at least one of the electrode layer and the panel ground layer.

2. The display device according to claim 1,
    wherein the touchscreen has a base layer, and
    wherein the touch ground layer is disposed at a first surface of the base layer or a second surface of the base layer.

3. The display device according to claim 1, wherein the touch ground layer has a width greater than a width of the panel ground layer,
    wherein the width is measured in a direction that is parallel to a touch surface of the touchscreen.

4. The display device according to claim 1, wherein:
    the touchscreen has a base layer,
    the touch ground layer comprises a first touch ground layer disposed at a first surface of the base layer, and a second touch ground layer disposed at a second surface of the base layer, and
    the second surface of the base layer is a surface facing the display panel.

5. The display device according to claim 4, wherein the second touch ground layer has an area spaced apart from the electrode layer and overlapping with the panel ground layer.

6. The display device according to claim 4, wherein the second touch ground layer has an area adjacent to the electrode layer while overlapping with the panel ground layer.

7. The display device according to claim 4, wherein the second touch ground layer has a first area overlapping with the electrode layer, and a second area overlapping with the panel ground layer.

8. The display device according to claim 5, further comprising:
    a polarization plate between the display panel and the touchscreen; and
    an optically clear adhesive layer between the polarization plate and the touchscreen.

9. The display device according to claim 4, further comprising:
    a polarization plate between the display panel and the touchscreen; and
    an optically clear adhesive layer between the polarization plate and the touchscreen,
    wherein the second touch ground layer does not overlap with the panel ground layer while overlapping with the electrode layer.

10. The display device according to claim 4, wherein the second touch ground layer has a width greater than a width of the panel ground layer, and wherein the second touch ground layer has a width equal to or greater than a width of the first touch ground layer,
    wherein the width is measured in a direction that is parallel to a touch surface of the touchscreen.

11. The display device according to claim 1, further comprising:
    an optically clear adhesive layer on the touchscreen; and
    a cover substrate on the optically clear adhesive layer.

12. The display device according to claim 1, wherein the display panel has a lower substrate and an upper substrate and at least one of the lower substrate or the upper substrate is formed of a plastic material.

13. The display device according to claim 12, wherein the panel ground layer and the shift register are both on the lower substrate.

14. A display device comprising:
    a display panel having an electrode layer in a display area and a non-display area, a shift register in a non-display area adjacent to the display area and overlapping with the electrode layer, and a panel ground layer at a periphery of the non-display area, the panel ground layer on a same layer as the shift register;
    a polarization plate on the display panel;
    a lower optically clear adhesive layer on the polarization plate;
    a touchscreen on the lower optically clear adhesive layer, the touchscreen including a touch ground layer having an area overlapping with at least one of the electrode layer and the panel ground layer;
    an upper optically clear adhesive layer on the touchscreen; and a cover substrate on the upper optically clear adhesive layer.

15. The display device according to claim 14, wherein:

the touchscreen has a base layer;

the touch ground layer comprises a first touch ground layer at a first surface of the base layer, and a second touch ground layer at a second surface of the base layer; and the second surface of the base layer is a surface facing the display panel.

16. The display device according to claim 15, wherein the second touch ground layer has a width greater than a width of the panel ground layer, and the second touch ground layer has a width equal to or greater than a width of the first touch ground layer, wherein the width is measured in a direction that is parallel to a touch surface of the touchscreen.

17. The display device according to claim 14, wherein the display panel further comprises a lower substrate and the panel ground layer and the shift register are both on the lower substrate.

\* \* \* \* \*